(12) United States Patent  
Guo (10) Patent No.: US 6,323,077 B1
(45) Date of Patent: Nov. 27, 2001

(54) INVERSE SOURCE/DRAIN PROCESS USING DISPOSABLE SIDEWALL SPACER

(75) Inventor: Jyh-chyurn Guo, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/475,822

(22) Filed: Dec. 30, 1999

(51) Int. Cl.$^7$ ................ H01L 21/8238; H01L 21/336
(52) U.S. Cl. .................... 438/231; 438/301; 438/303
(58) Field of Search .................... 438/231, 264, 438/266, 301, 303, 304, 305

(56) References Cited

U.S. PATENT DOCUMENTS

| | | | | |
|---|---|---|---|---|
| 5,710,054 | * | 1/1998 | Gardner et al. | 437/44 |
| 5,869,378 | * | 2/1999 | Michael | 438/305 |
| 5,912,493 | * | 6/1999 | Gardner et al. | 257/344 |
| 5,920,104 | * | 7/1999 | Nayak et al. | 257/408 |
| 5,989,967 | * | 11/1999 | Gardner et al. | 438/305 |
| 6,153,455 | * | 11/2000 | Ling et al. | 438/231 |
| 6,200,869 | * | 3/2001 | Yu et al. | 438/301 |
| 6,211,027 | * | 4/2001 | Lin et al. | 438/303 |

* cited by examiner

Primary Examiner—John F. Niebling
Assistant Examiner—Walter L. Lindsay, Jr.
(74) Attorney, Agent, or Firm—Martine & Penilla, LLP (57) ABSTRACT

The present invention discloses an inverse source/drain process using disposable sidewall, for forming an LDD MOSFET device on a semiconductor substrate, comprises the following steps: forming a gate electrode on the semiconductor substrate; forming a disposable sidewall spacer adjacent to each of opposite sides of the gate electrode; implanting a heavy dose of a dopant into the semiconductor substrate to form a heavily doped region; removing the disposable sidewall spacer; and implanting a light dose of a dopant into the semiconductor substrate to form a lightly doped region. The present invention employs the disposable sidewall spacer to accomplish the inverse-sequence ion-implantation steps so as to greatly reduce the transient enhanced diffusion (TED) caused by the ion implantation with a heavy dose. As a result, the present invention achieves the ultra-shallow junction applicable to submicron MOS device.

17 Claims, 7 Drawing Sheets

INVERSE SOURCE/DRAIN PROCESS USING DISPOSABLE SIDEWALL SPACER

FIELD OF THE INVENTION

The present invention relates to an inverse source/drain process using disposable sidewall spacer, and more particularly to an inverse source/drain process using disposable sidewall spacer for fabricating submicron lightly-doped-drain (LDD) metal-oxide-semiconductor field-effect transistor (MOSFET) devices provided on a semiconductor substrate.

BACKGROUND OF THE INVENTION

In advanced semiconductor integrated circuits (ICs), a MOSFET is widely used to achieve various objects and electronic applications. For example, the cell of dynamic random access memory (DRAM) is mostly composed of a MOSFET and a capacitor nowadays. Along with the development of the semiconductor technology, the size of a MOSFET is greatly reduced to submicron range in order to increase the integration of the semiconductor memory. In other words, more memory cells composed of the MOSFET can be incorporated on a single semiconductor substrate. The increase of the integration brings two advantages: rising of the production rate and falling of the production cost.

However, in the submicron MOSFET, there are several technical problems to be solved. One of these problems is the so-called hot carrier effect which will be described in the following. As a result of the size reduction, the carrier channel between the source and the drain regions in the MOSFET is shortened. Therefore, carriers with extremely high energy are generated in the channel when carriers supplied from the source/drain region are sharply accelerated by a high electric field near a pinch-off region in vicinity of the source/drain junction. These carriers are named as hot carriers due to the extremely high energy. The hot carriers may inject into the gate oxide and deteriorate the MOSFET.

As a solution to the hot carrier problem, a MOSFET with a lightly doped drain (LDD) structure is proposed. In the following, the process for fabricating the LDD MOSFET will be described in detail with reference to FIGS. 1(a) to 1(f).

Figure 1A:
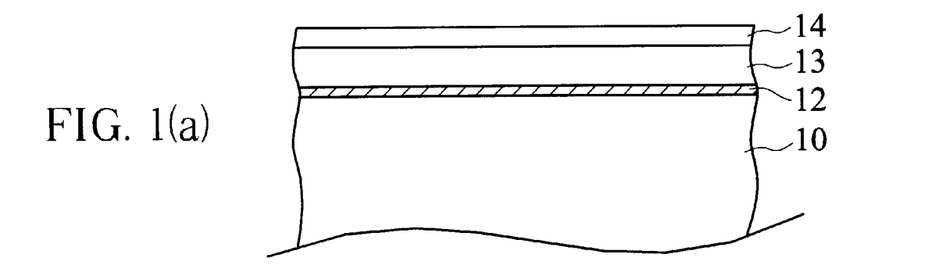
FIGS. 1(a) to 1(f) are cross-sectional views showing a conventional process for fabricating an LDD MOSFET.

FIGS. 1(a) to 1(f) are cross-sectional views showing the conventional process for fabricating an LDD MOSFET, especially an N-type LDD MOSFET (referred to as NMOS in the following). As shown in FIG. 1(a), a gate oxide film 12 is formed on a semiconductor substrate 10 such as silicon. Next, a polysilicon film 13 and a cap gate oxide film 14 are formed on the gate oxide film 12, respectively.

Figure 1B:
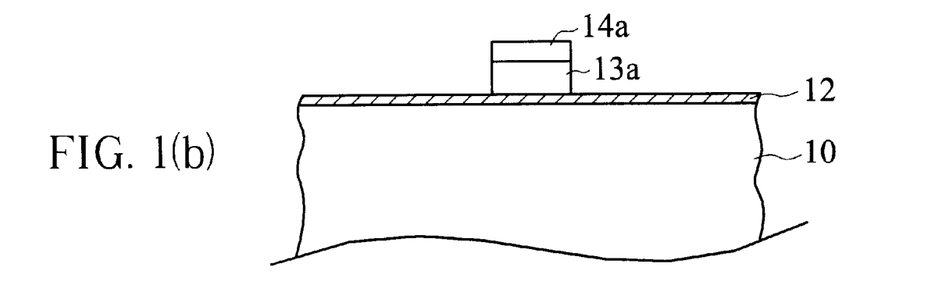

Referring to FIG. 1(b), the cap gate oxide film 14 and the polysilicon film 13 are etched through applying a selective etching method so as to define a gate electrode 13a covered with an oxide film 14a on the gate oxide film 12.

Figure 1C:
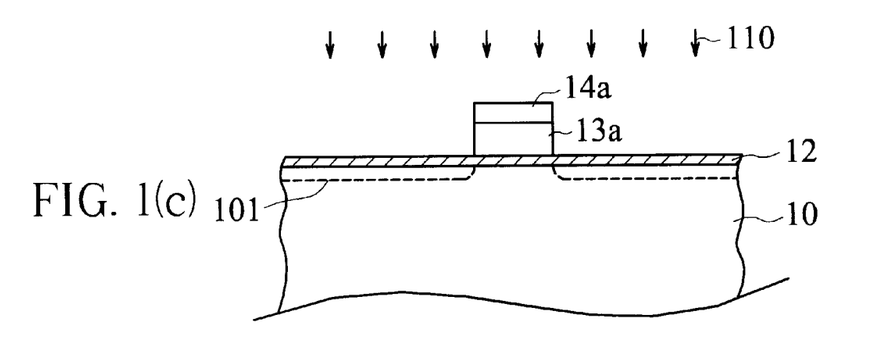

Referring to FIG. 1(c), a first ion implantation 110 using phosphorus ions is conducted over the whole surface of the resulting structure shown in FIG. 1(b) with a light dose and a low implanting energy to form lightly doped N-type source/drain regions 101.

Figure 1D:
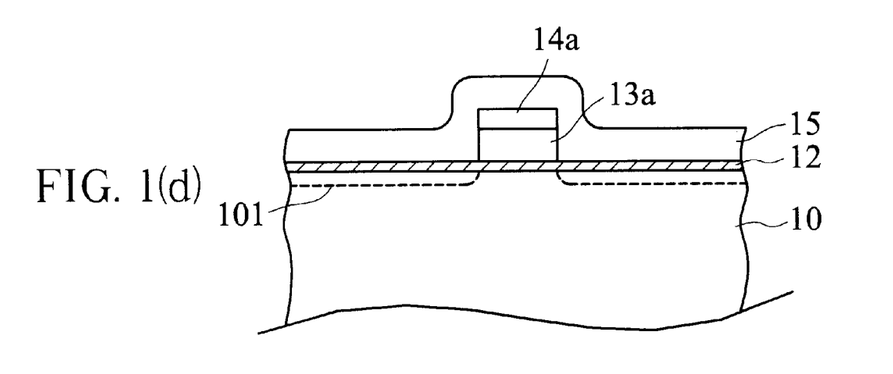

Referring to FIG. 1(d), a silicon oxide film 15 is deposited over the whole surface of the resulting structure shown in FIG. 1(c) through the conventional chemical vapor deposition (CVD) method. Subsequently, the silicon oxide film 15 and the gate oxide film 12 are partially etched through the conventional reactive ion etching (RIE) method such that part of the silicon oxide film 15 and the gate oxide film 12 are remained to form sidewall spacers 15a adjacent to each of opposite sides of the gate electrode 13a and the oxide film 14a, as shown in FIG. 1(e).

Figure 1E:
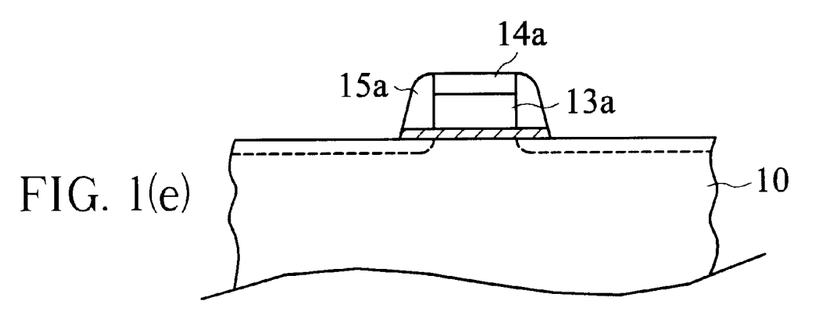
Figure 1F:
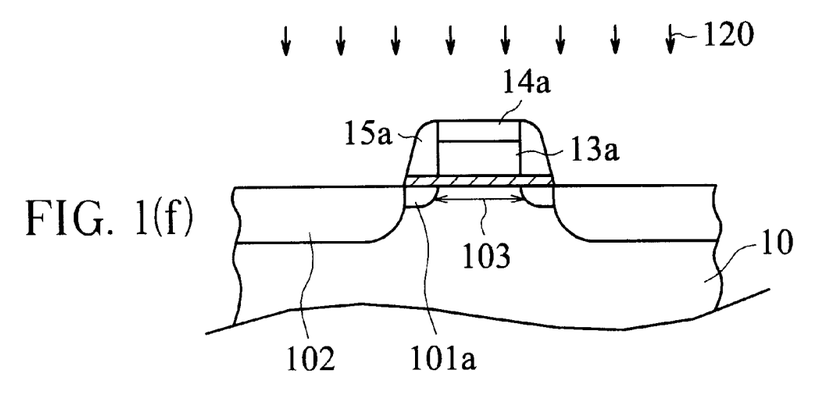

Thereafter, referring to FIG. 1(f), using the sidewall spacers 15a as a mask, a second ion implantation 120 using arsenic ions is conducted over the whole surface of the resulting structure shown in FIG. 1(e) with a larger dose and a higher implanting energy than the first ion implantation. As a result, heavily doped N-type source/drain regions 102 having deeper junctions are formed and the conventional LDD NMOS is completed.

It is apparent in FIG. 1(f) that LDD NMOS has a self-aligned lightly doped N-type region 101a formed between the channel 103 and the heavily doped N-type source/drain region 102. Because this lightly doped N-type region 101a spreads out the high electric field in vicinity of the drain junction, the above-mentioned carrier electrons supplied from the source region are prevented from extraordinary high field's acceleration. Consequently, the hot carrier problem generally suffered in submicron MOSFET is avoided through the use of the LDD structure.

Although the effectiveness and achievement of the LDD structure is evidential, however, the conventional process still has several disadvantages.

In the first place, the lightly doped N-type region 101a is formed before the formation of the sidewall spacer 15a, so it is subjected to the thermal budget associated with the formation of the sidewall spacer 15a. In other words, the lightly doped N-type region 101a extends in both vertical and horizontal direction during the formation of the sidewall spacer as a result of the transient enhanced diffusion (TED) of the LDD dopant (i.e., phosphorus ions in LDD NMOS case).

Further, the first ion implantation 110 for forming the lightly doped N-type region 101a produces defects, such as silicon interstitials, in the semiconductor substrate. These defects will interact with the dopant, resulting in TED of the dopant.

At last, heavily doped N-type source/drain region 102 formed through the second ion implantation after the formation of the sidewall spacer 15a generates much more defects and further enhances TED of the dopant.

Therefore, it is difficult for the conventional process to achieve an ultra-shallow junction applicable to submicron device.

SUMMARY OF THE INVENTION

In view of the disadvantages of the conventional process for fabricating an LDD MOSFET, it is therefore an object of the present invention to provide a novel process in which the lightly doped region is formed after the formation of the sidewall spacer, thereby protecting it from the thermal budget associated with the formation of the sidewall spacer.

It is another object of the present invention to provide a novel process in which the ion implantation with a heavy dose is conducted before the LDD implantation and followed by a rapid thermal anneal to remove the defects generated by heavy dose implantation instantaneously, thereby preventing the TED of the LDD dopant caused by the interaction with the defects generated by heavy dose implantation.

It is still another object of the present invention to provide a novel process in which the ion implantation with a heavy dose is conducted before the ion implantation with a light dose, thereby preventing the TED of the dopant, which caused by the damage and defects generated by heavy dose implantation.

An inverse source/drain process using disposable sidewall spacer according to the present invention, for forming a MOSFET device on a semiconductor substrate, comprises the following steps: a gate oxide formation step for forming a gate oxide film on the surface of the semiconductor substrate; a first deposition step for depositing a conductive film on the gate oxide film; a photoresist mask formation step for forming a patterned photoresist film on the conductive film through the photolithography; a gate electrode formation step for etching the conductive film to form a gate electrode by using the patterned photoresist film as a mask; a second deposition step for depositing an insulating film over the gate electrode and the gate oxide film; a spacer formation step for partially etching the insulating film to form a disposable sidewall spacer adjacent to each of opposite sides of the gate electrode; a heavily doped region formation step for conducting a first ion implantation to form a heavily doped region within the semiconductor substrate; a spacer removal step for removing the disposable sidewall spacer; and a lightly doped region formation step for conducting a second ion implantation to form a lightly doped region within the semiconductor substrate.

BRIEF DESCRIPTION OF THE DRAWINGS

The above and other objects, features, and advantages of the present invention will become more apparent from the following detailed description of embodiments taken in conjunction with the accompanying drawings, wherein.

DETAILED DESCRIPTION OF THE PREFERRED EMBODIMENTS

The preferred embodiment according to the present invention will now be described in detail with reference to FIGS. 2(a) to 2(h).

Figure 2A:
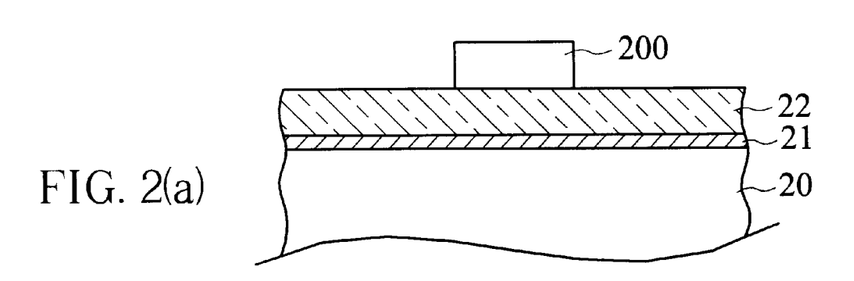
FIGS. 2(a) to 2(h) are cross-sectional views showing the process for fabricating an LDD MOSFET using disposable sidewall spacers according to the present invention.

As shown in FIG. 2(a), a gate oxide film 21 having a thickness of about 6 to 9 nm is formed on a semiconductor substrate 20 such as silicon through the conventional heat treatment. Next, a conductive film 22 such as polysilicon film having a thickness of about 100 to 150 nm is formed on the gate oxide film 12 through the CVD method. It is noticed that the conductive film 22 may comprise a plurality of laminated layers, for example, a polysilicon layer; a tungsten silicide layer forming on the polysilicon layer; a silicon oxide layer forming on the tungsten silicide layer; and a silicon nitride layer forming on the silicon oxide layer, respectively. Thereafter, a patterned photoresist film 200 is formed on the conductive film 22 through the conventional photolithography.

Figure 2B:
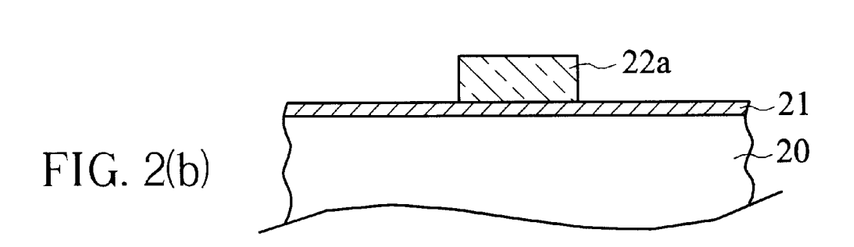

Referring to FIG. 2(b), the conductive film 22 are selectively etched by using the photoresist film 200 as a mask so as to define a gate electrode 22a on the gate oxide film 21. Thereafter, the resulting structure may be heated in the conventional furnace (not shown) to anneal for a predetermined time duration.

Figure 2C:
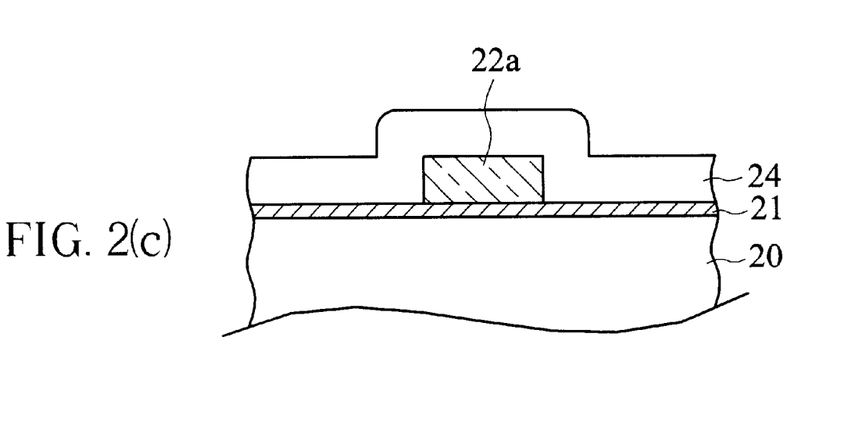
Figure 2D:
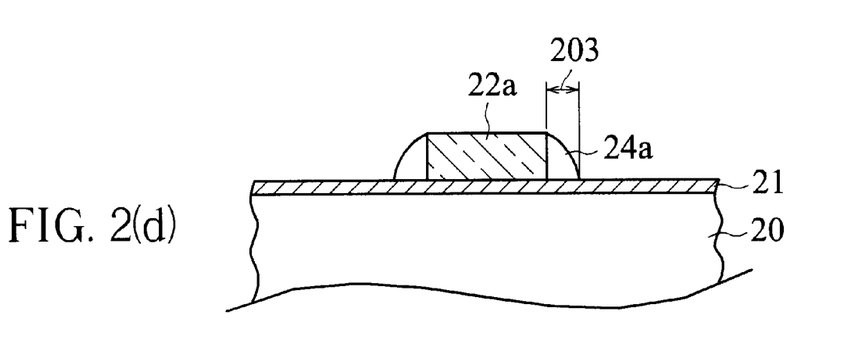

Referring to FIG. 2(c), an insulating film 24 made of, for example, silicon nitride is deposited over the whole surface of the resulting structure shown in FIG. 2(b) through the CVD method. Subsequently, the insulating film 24 is partially etched through the RIE method such that part of the insulating film 24 is remained to form disposable sidewall spacers 24a adjacent to each of opposite sides of the gate electrode 22a, as shown in FIG. 2(d). In the present embodiment, the lateral thickness 203 of the disposable sidewall spacer 24a is substantially in the range of 20 nm to 60 nm, preferably 40 nm.

Figure 2E:
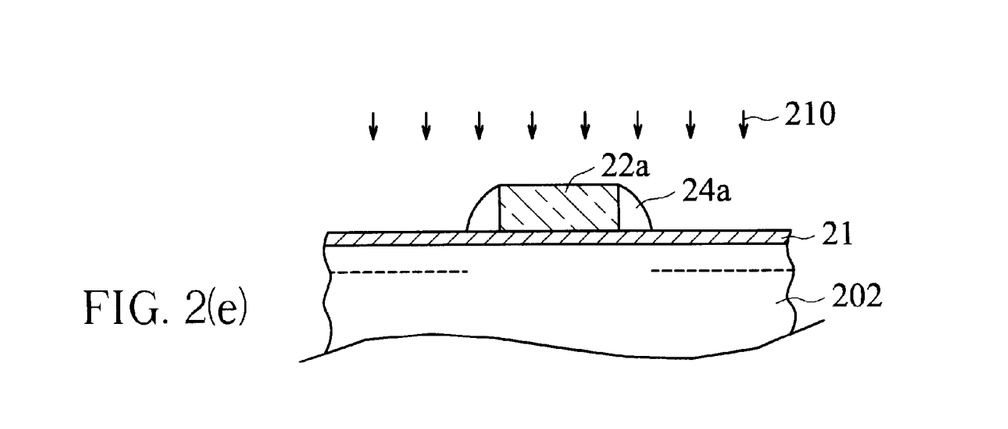

Referring to FIG. 2(e), using the gate electrode 22a and the disposable sidewall spacers 24a as a mask, a first ion implantation 210 using, for example, arsenic ions is conducted over the whole surface of the resulting structure shown in FIG. 2(d) to form heavily doped N-type source/drain regions 202 having deep junctions within the semiconductor substrate. In the present embodiment, the first ion implantation 210 is conducted with, for example, a dose amount of about $1 \times 10^{15}$ to $5 \times 10^{15}$ ($1/cm^3$) and an implanting energy of about 30 to 60 keV.

Figure 2F:
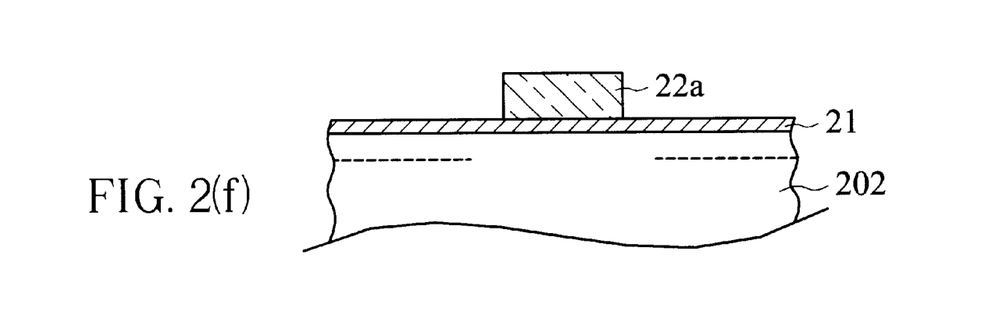

Referring to FIG. 2(f), after the first ion implantation 210, the disposable sidewall spacers 24a are removed through the conventional etching method, for example, the wet etching method using an etching solution containing $H_3PO_4$. Next, the resulting structure is annealed through the rapid thermal annealing (RTA) method at a temperature of about 950° C. to 1050° C. for about 10 to 30 seconds. Therefore, the damage or defects generated by the first ion implantation 210 are eliminated.

Figure 2G:
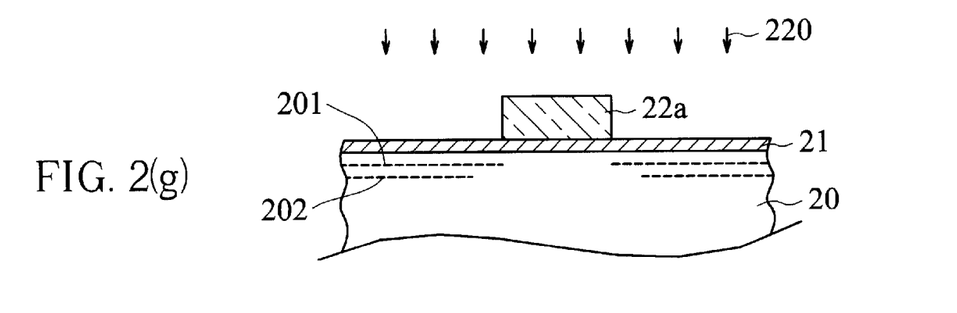

Thereafter, referring to FIG. 2(g), using the gate electrode 22a as the mask, a second ion implantation 220 using, for example, phosphorus ions is conducted over the whole surface of the resulting structure shown in FIG. 2(f) to form lightly doped N-type source/drain regions 201 having shallower junctions within the semiconductor substrate. In the present embodiment, the second ion implantation 220 is conducted with, for example, a dose amount of about $1 \times 10^{13}$ to $3 \times 10^{13}$ ($1/cm^3$) and an implanting energy of about 10 to 30 keV.

Figure 2H:
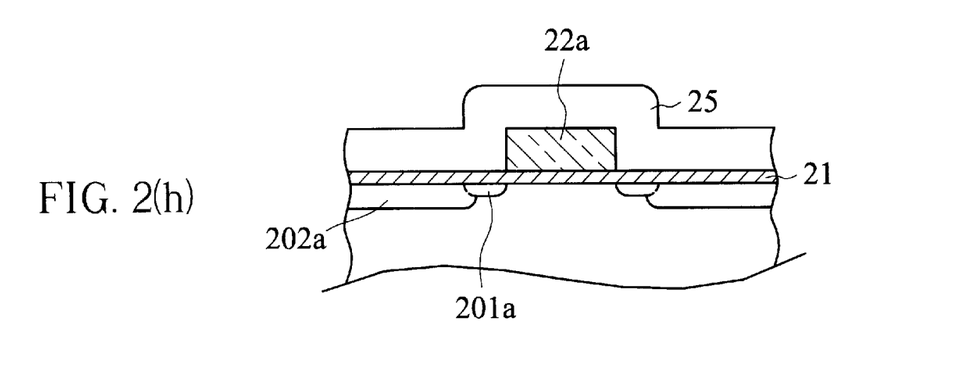

Thereafter, the resulting structure shown in FIG. 2(g) is annealed through the RTA method at a temperature of about 950° C. to 1050° C. for about 10 to 30 seconds. Therefore, the damage or defects generated by the second ion implantation 220 are eliminated. Finally, an isolated film 25 is deposited over the whole surface, and the LDD MOSFET having a source/drain region composed of a lightly doped region 201a and a heavily doped region 202a according to the present invention is completed.

In the process according to the present invention, contrary to the conventional process described above, the ion implantation 210 with a heavy dose is prior to the ion implantation 220 with a light dose through employing the disposable sidewall spacer 24a, so it is called the inverse source/drain process. Therefore, the process according to the present invention can prevent the TED of the LDD dopant caused by the interaction with the defects generated by heavy dose implantation. Moreover, the TED of the dopant enhanced during the ion implantation with a heavy dose is also prevented due to the inverse-sequence ion implantation steps according to the present invention.

Furthermore, the lightly doped N-type region 201 is formed after the formation of the disposable sidewall spacer 24a. As a result, in the present invention, the lightly doped N-type region 201 is not subjected to the thermal budget associated with the formation of the disposable sidewall spacer 24a.

Therefore, the process according to the present invention avoids the above-mentioned disadvantages of the conventional process.

It is noticed that another inverse source/drain process is disclosed in U.S. Pat. No. 5,468,665. However, there are several differences between this prior patent and the present invention and described in the following.

(1) It is necessary for U.S. Pat. No. 5,468,665 to form an auxiliary layer made of silicon oxide and, later, to selectively etch it to form a auxiliary pattern. However, the process according to the present invention does not need the auxiliary layer and, therefore, becomes simpler.

(2) The formation of the gate electrode in U.S. Pat. No. 5,468,665 is completed through two-step etching. One of the two steps is conducted by utilizing the auxiliary layer and a temporary sidewall spacer as a mask, and the other is conducted by utilizing the auxiliary layer as a mask. However, there is only one etching step for forming the gate electrode in the process according to the present invention.

(3) In U.S. Pat. No. 5,468,665, the LDD MOSFET is annealed in the conventional furnace at a temperature of about 870° C. for about 40 minutes, while the process according to the present invention utilizes the RTA method to anneal at a higher temperature of about 950° C. to 1050° C. for a shorter time duration of about 10 to 30 seconds. The RTA method provides a smaller thermal budget to sufficiently prevent the dopant from diffusing in both vertical and horizontal directions. As a result, the present invention achieves a shallower junction than that in U.S. Pat. No. 5,468,665.

Although the present invention is described in detail with reference to the process for forming the NMOS device accompanying with the drawings, it is not limited to NMOS devices and also applicable to the fabrication of PMOS (P-type MOS) or CMOS (complementary MOS) devices. When the process according to the present invention is applied to fabricate the PMOS device, for example, the first ion implantation 210 utilizes $BF_2$ as a dopant and is conducted with the dose amount of about $1 \times 10^{15}$ to $4 \times 10^{15}$ (1/cm$^3$) and the implanting energy of about 25 to 50 keV, while the second ion implantation 220 utilizes $BF_2$ as a dopant and is conducted with the dose amount of about $1 \times 10^{13}$ to $5 \times 10^{13}$ (1/cm$^3$) and the implanting energy of about 10 to 20 keV.

In summary, the present invention has disclosed an inverse source/drain process using disposable sidewall spacers for forming an LDD MOSFET in a semiconductor substrate. The present invention employs the disposable sidewall spacer to accomplish the inverse-sequence ion implantation steps so as to greatly reduce the transient enhanced diffusion (TED) caused by the ion implantation with a heavy dose. As a result, the present invention achieves the ultra-shallow junction applicable to submicron MOS device.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An inverse source/drain process using disposable sidewall spacer, for forming a MOSFET device on a semiconductor substrate, comprising the following steps:

a gate oxide formation step for forming a gate oxide film on the surface of said semiconductor substrate;

a first deposition step for depositing a conductive film on said gate oxide film;

a photoresist mask formation step for forming a patterned photoresist film on said conductive film through the photolithography;

a gate electrode formation step for etching said conductive film to form a gate electrode by using said patterned photoresist film as a mask;

a second deposition step for depositing an insulating film over said gate electrode and said gate oxide film;

a spacer formation step for partially etching said insulating film to form a disposable sidewall spacer adjacent to each of opposite sides of said gate electrode;

a heavily doped region formation step for conducting a first ion implantation to form a heavily doped region within said semiconductor substrate;

a spacer removal step for removing said disposable sidewall spacer;

a first rapid thermal annealing step for reducing defects in said semiconductor substrate; and a lightly doped region formation step for conducting a second ion implantation to form a lightly doped region within said semiconductor substrate.

2. A process according to claim 1, wherein said conductive film is made of polysilicon.

3. A process according to claim 1, wherein said conductive film is composed of a plurality of laminated layers comprising:

a polysilicon layer;

a tungsten silicide layer forming on said polysilicon layer;

a silicon oxide layer forming on said tungsten silicide layer; and a silicon nitride layer forming on said silicon oxide layer.

4. A process according to claim 1, wherein said insulating film is made of silicon nitride.

5. A process according to claim 1, wherein said spacer removal step is conducted through a wet etching method using an etching solution containing $H_3PO_4$.

6. A process according to claim 1, wherein said first rapid thermal annealing step is conducted at a temperature of about 950° C. to 1050° C. for about 10 to 30 seconds.

7. An inverse source/drain process using disposable sidewall spacer, for forming a MOSFET device on a semiconductor substrate, comprising the following steps:

a gate oxide formation step for forming a gate oxide film on the surface of said semiconductor substrate;

a first deposition step for depositing a conductive film on said gate oxide film;

a photoresist mask formation step for forming a patterned photoresist film on said conductive film through the photolithography;

a gate electrode formation step for etching said conductive film to form a gate electrode by using said patterned photoresist film as a mask;

a second deposition step for depositing an insulating film over said gate electrode and said gate oxide film;

a spacer formation step for partially etching said insulating film to form a disposable sidewall spacer adjacent to each of opposite sides of said gate electrode;

a heavily doped region formation step for conducting a first ion implantation to form a heavily doped region within said semiconductor substrate;

a spacer removal step for removing said disposable sidewall spacer;

a lightly doped region formation step for conducting a second ion implantation to form a lightly doped region within said semiconductor substrate; and a second rapid thermal annealing step for reducing defects in said semiconductor substrate.

8. A process according to claim 7, wherein said conductive film is made of polysilicon.

9. A process according to claim 7, wherein said conductive film is composed of a plurality of laminated layers comprising:

a polysilicon layer;

a tungsten suicide layer forming on said polysilicon layer;

a silicon oxide layer forming on said tungsten silicide layer; and a silicon nitride layer forming on said silicon oxide layer.

10. A process according to claim 7, wherein said insulating film is made of silicon nitride.

11. A process according to claim 7, wherein said spacer removal step is conducted through a wet etching method using an etching solution containing $H_3PO_4$.

12. A process according to claim 7, wherein said second rapid thermal annealing step is conducted at a temperature of about 950° C. to 1050° C. for about 10 to 30 seconds.

13. An inverse source/drain process using disposable sidewall spacer, for forming a MOSFET device on a semiconductor substrate, comprising the following steps:

a gate oxide formation step for forming a gate oxide film on the surface of said semiconductor substrate;

a first deposition step for depositing a conductive film on said gate oxide film;

a photoresist mask formation step for forming a patterned photoresist film on said conductive film through the photo lithography;

a gate electrode formation step for etching said conductive film to form a gate electrode by using said patterned photoresist film as a mask;

a heat treatment step for annealing in a furnace for a predetermined time duration;

a second deposition step for depositing an insulating film over said gate electrode and said gate oxide film;

a spacer formation step for partially etching said insulating film to form a disposable sidewall spacer adjacent to each of opposite sides of said gate electrode;

a heavily doped region formation step for conducting a first ion implantation to form a heavily doped region within said semiconductor substrate;

a spacer removal step for removing said disposable sidewall spacer; and a lightly doped region formation step for conducting a second ion implantation to form a lightly doped region within said semiconductor substrate.

14. A process according to claim 13, wherein said conductive film is made of polysilicon.

15. A process according to claim 13, wherein said conductive film is composed of a plurality of laminated layers comprising:

a polysilicon layer;

a tungsten silicide layer forming on said polysilicon layer;

a silicon oxide layer forming on said tungsten silicide layer; and a silicon nitride layer forming on said silicon oxide layer.

16. A process according to claim 13, wherein said insulating film is made of silicon nitride.

17. A process according to claim 13, wherein said spacer removal step is conducted through a wet etching method using an etching solution containing $H_3PO_4$.

* * * * *